(12) United States Patent
Mattila et al.

(10) Patent No.: US 11,649,092 B2
(45) Date of Patent: May 16, 2023

(54) PLASTIC ENCLOSURE FOR ENCLOSING INDUSTRIAL COMPONENTS

(71) Applicant: Ensto Building Systems Oy, Porvoo (FI)

(72) Inventors: Reijo Mattila, Vantaa (FI); Timo Tuomisto, Helsinki (FI); Markus Niemi, Nurmijärvi (FI); Turkka Heiska, Helsinki (FI); Marjo Kurri, Helsinki (FI)

(73) Assignee: Ensto Building Systems Oy, Porvoo (FI)

( * ) Notice: Subject to any disclaimer, the term of this patent is extended or adjusted under 35 U.S.C. 154(b) by 404 days.

(21) Appl. No.: 16/761,940

(22) PCT Filed: Nov. 8, 2017

(86) PCT No.: PCT/FI2017/050768
§ 371 (c)(1),
(2) Date: May 6, 2020

(87) PCT Pub. No.: WO2019/092304
PCT Pub. Date: May 16, 2019

(65) Prior Publication Data
US 2020/0324943 A1  Oct. 15, 2020

(51) Int. Cl.
*B65D 43/16*  (2006.01)
*B65D 43/22*  (2006.01)
(Continued)

(52) U.S. Cl.
CPC .......... *B65D 43/163* (2013.01); *B65D 43/22* (2013.01); *E05C 19/14* (2013.01); *B65D 45/16* (2013.01);
(Continued)

(58) Field of Classification Search
CPC ...... B65D 43/163; B65D 43/22; B65D 45/16; B65D 2251/1058; B65D 2543/00296;
(Continued)

(56) References Cited

U.S. PATENT DOCUMENTS 4,705,308 A * 11/1987 Bisbing .................. E05C 19/14
292/108
5,667,261 A *  9/1997 Weinerman ............. E05C 19/14
292/113
(Continued)

FOREIGN PATENT DOCUMENTS

DE   195 05 425 A1   8/1996
EP   2 387 297 A2   11/2011
FR      535 455 A    4/1922

OTHER PUBLICATIONS

English translation of DE 19505425 by Espacenet. (Year: 2022).*
(Continued)

*Primary Examiner* — James N Smalley
(74) *Attorney, Agent, or Firm* — Merchant & Gould P.C.

(57) ABSTRACT

The invention relates to a plastic enclosure for enclosing industrial components. The enclosure comprises a case (2), a lid (9), and a latch device (13) for locking the lid to the case. The lid (9) has a grip means formed as a rigid lug (14) molded to be monolithic with the lid (9), the lug comprising a throughhole (19) to which a hook portion (17) of a rocker (15) can grip. The lug (14) is arranged, in the closed position of the lid, to extend over and at a distance from the second wall (7) to be substantially in parallel with a wall of the case to limit an intermediate space between the wall (7) and the lug (14) when the lid is in the closed position. The hook portion (17) is arranged so that, in the release position (II) of the rocker (15), it is turned inside the intermediate space away from the path of the lug (14) and, in the locking position (I) of the rocker, the hook portion is turned to
(Continued)

protrude laterally outwards through the through-hole (19) of the lug (14) and to compress the sealing gasket (12) by pressing the sealing flange (8) against the sealing gasket (12) to create a spring force against which the hook portion holds the lug (14). The output force of the hook portion (17) exerted to the lug (14) is amplified by a mechanical advantage provided by a lever effect of the rocker (15) when being turned to the locking position by an input force exerted to the handle arm (18).

13 Claims, 6 Drawing Sheets

(51) Int. Cl.
*E05C 19/14* (2006.01)
*B65D 45/16* (2006.01)
*H05K 5/02* (2006.01)

(52) U.S. Cl.
CPC ............ *B65D 2251/1058* (2013.01); *B65D 2543/00296* (2013.01); *B65D 2543/00537* (2013.01); *H05K 5/0221* (2013.01); *Y10S 292/49* (2013.01); *Y10T 292/0917* (2015.04)

(58) Field of Classification Search
CPC ........ B65D 2543/00537; H05K 5/0221; E05C 19/14; Y10S 292/49; Y10T 292/0917
USPC .......................................... 220/324, 833–835
See application file for complete search history.

(56) References Cited

U.S. PATENT DOCUMENTS

| | | | |
|---|---|---|---|
| 6,032,988 | A | 3/2000 | Klein |
| 6,789,692 | B2 * | 9/2004 | Prezelin ................. B65D 45/20 220/360 |
| 2008/0307835 | A1 | 12/2008 | Grenier et al. |
| 2009/0114646 | A1 | 5/2009 | Whalen |
| 2013/0043250 | A1 | 2/2013 | Kreidler et al. |

OTHER PUBLICATIONS

International Search Report for corresponding International Patent Application No. PCT/FI2017/050768 dated Sep. 16, 2018, 5 pages.
Written Opinion of the International Searching Authority for corresponding International Patent Application No. PCT/FI2017/050768 dated Sep. 13, 2018, 9 pages.

* cited by examiner

PLASTIC ENCLOSURE FOR ENCLOSING INDUSTRIAL COMPONENTS

This application is a National Stage Application of PCT/FI2017/050768, filed 8 Nov. 2017 and which application is incorporated herein by reference. To the extent appropriate, a claim of priority is made to the above disclosed application.

FIELD OF THE INVENTION

The present invention relates to a molded plastic enclosure for enclosing industrial components.

BACKGROUND OF THE INVENTION

Enclosures are available for protecting industrial equipment in numerous applications from various external risk factors, among them dust, water, moisture, impacts and tampering. Such enclosures are commonly called as industrial enclosures. The industrial components to be enclosed in such an enclosure may be e.g. electrical components, electronic components, and/or equipment that does not involve electricity, such as pneumatic equipment, hydraulic equipment, fiber optics equipment, such as optic fiber splices, optic fiber connectors, optic fiber amplifiers etc. The enclosure must also provide a degree of protection to personnel against incidental contact with the equipment enclosed in the enclosure. Further, the enclosure must provide a degree of protection against the surrounding environment for enclosed equipment. Frequent access to the components within such enclosures is common for adjustments, maintenance, and inspection of the components. The enclosure comprises a case and a lid which is hinged to be openable and closable to be sealed thereto. A resilient sealing gasket is attached to the lid and arranged to act between the lid and the case. A latch device is arranged for locking the lid to the case. When closing the lid, the sealing gasket provides a spring force against which the latch device must provide a counter force in order to close the lid tightly. Especially in large enclosures the latch device must be able to provide a considerably large closing force to counteract the spring force of the sealing gasket. Sometimes also such an enclosure may be installed at a high place above the installer's head whereby the operator or installer must work with outreached hands to reach the enclosure. In that situation in order to close the lid and in order to operate the latch device both hands would be needed. The lid must be pressed with one hand to compress the sealing gasket while the latch device is operated with another hand. It is difficult to cause a large force with an outreached hand. Therefore it would be desirable to have an enclosure having a simple structured latch device which can be operated with only one hand and by exerting force only lightly. It would also be desirable to have an enclosure having a latch device which can provide a sufficiently large closing force of the lid with a simple structure without any need for a complicated mechanism including many movable parts.

SUMMARY OF THE INVENTION

According to an aspect, the present invention provides a plastic enclosure for enclosing industrial components. The plastic enclosure comprises a case molded from plastics comprising a rear wall and four side walls delimiting an interior, a mouth opening enabling access to the interior, the side walls comprising a first side wall and a second side wall which is parallel to the first side wall, and a sealing flange defining an outer periphery of the mouth opening. The plastic enclosure further comprises a lid molded from plastics for covering the case, the lid being hinged at the side of the first side wall by one or more hinges to be movable between a closed position, wherein the lid covers the mouth opening of the case, and an open position to permit access to the interior. The hinge is located near to the mouth opening. The lid has a groove arranged at the periphery of the lid to receive therein a resilient sealing gasket to cooperate with the sealing flange when the lid is in the closed position. The plastic enclosure further comprises one or more a latch devices for locking the lid relative to the case in the closed position. The latch device comprises a grip means arranged to the lid and a rocker connected removably and pivotally with a pivot axle relative to the second side wall to be turnable about a single axis between a locking position and a release position. The rocker comprises a hook portion at one side of the pivot axle, which hook portion can grip the grip means, and a handle arm at the opposite side of the pivot axle in relation to the hook portion. The handle arm is arranged to be manually operable for turning the rocker about the pivot axis between the locking and release positions. The grip means is a rigid lug molded to be monolithic with the lid. The lug comprises a through-hole to which the hook portion can grip. The lug is arranged, in the closed position of the lid, to extend over and at a distance from the second side wall to be substantially in parallel with the second side wall to limit an intermediate space between the second wall and the lug when the lid is in the closed position. The hook portion is arranged so that, in the release position of the rocker, it is turned inside the intermediate space away from the path of the lug and, in the locking position of the rocker, the hook portion is turned to protrude laterally outwards through the through-hole of the lug and to compress the sealing gasket by pressing the sealing flange against the sealing gasket to create a spring force against which the hook portion holds the lug. The output force of the hook portion exerted to the lug is amplified by a mechanical advantage provided by a lever effect of the rocker when being turned to the locking position by an input force exerted to the handle arm.

In one embodiment of the plastic enclosure the latch device comprises a first snap-fit joint to hold the rocker stationary in the locking position.

In one embodiment of the plastic enclosure the latch device comprises a second snap-fit joint to hold the rocker stationary in the release position.

In one embodiment of the plastic enclosure the hook portion and the lug have a mutual contact point at a first radius from the pivot axis of the rocker. The handle arm has a second radius from the pivot axis of the rocker to an outmost point where the handle arm can be manually pressed by hand. The second radius is a multiple of the first radius in order to exert an output force by the hook portion on the lug. The output force is a multiple of the input force exerted to the handle arm to win the spring force provided by the sealing gasket when moving the rocker from the release position to the locking position.

In one embodiment of the plastic enclosure the ratio of the first radius to the second radius is in the range of 1:3 to 15, preferably 1:4.

In one embodiment of the plastic enclosure the rocker is a molded monolithic one-piece element of plastics, the rocker comprising a pair of pins which form the pivot axle.

In one embodiment of the plastic enclosure the case comprises a pair of mounting brackets for mounting the rocker. The mounting brackets are monolithic with the case.

In one embodiment of the plastic enclosure each mounting bracket comprises a seat to receive and to removably connect the pin of the rocker for pivotally supporting the rocker.

In one embodiment of the plastic enclosure the handle arm comprises a locking hole.

In one embodiment of the plastic enclosure the mounting bracket comprises a retaining projection which protrudes along and at a distance from the second wall. In the locking position of the rocker the locking hole is located between the second wall and the retaining projection to receive a locking element. The locking element may be e.g. a locking pin or a shackle of a padlock.

In one embodiment of the plastic enclosure the handle arm comprises one or more rigid clips to co-operate with one or more edges of the retaining projection to form the first snap-fit joint to hold the rocker in the locking position.

In one embodiment of the plastic enclosure the case comprises a prominent collar beside the mouth opening. The collar comprises a cutout which is disposed to receive the hook portion of the rocker therein. The collar has one or more edge portions near to the cutout. The rocker comprises one or more rigid clips arranged to co-operate with the one or more edge portions to form the second snap-fit joint to hold the rocker in the release position.

It is to be understood that the aspects and embodiments of the invention described above may be used in any combination with each other. Several of the aspects and embodiments may be combined together to form a further embodiment of the invention.

BRIEF DESCRIPTION OF THE DRAWINGS

The accompanying drawings, which are included to provide a further understanding of the invention and constitute a part of this specification, illustrate embodiments of the invention and together with the description help to explain the principles of the invention. In the drawings.

DETAILED DESCRIPTION OF THE INVENTION

Figure 1:
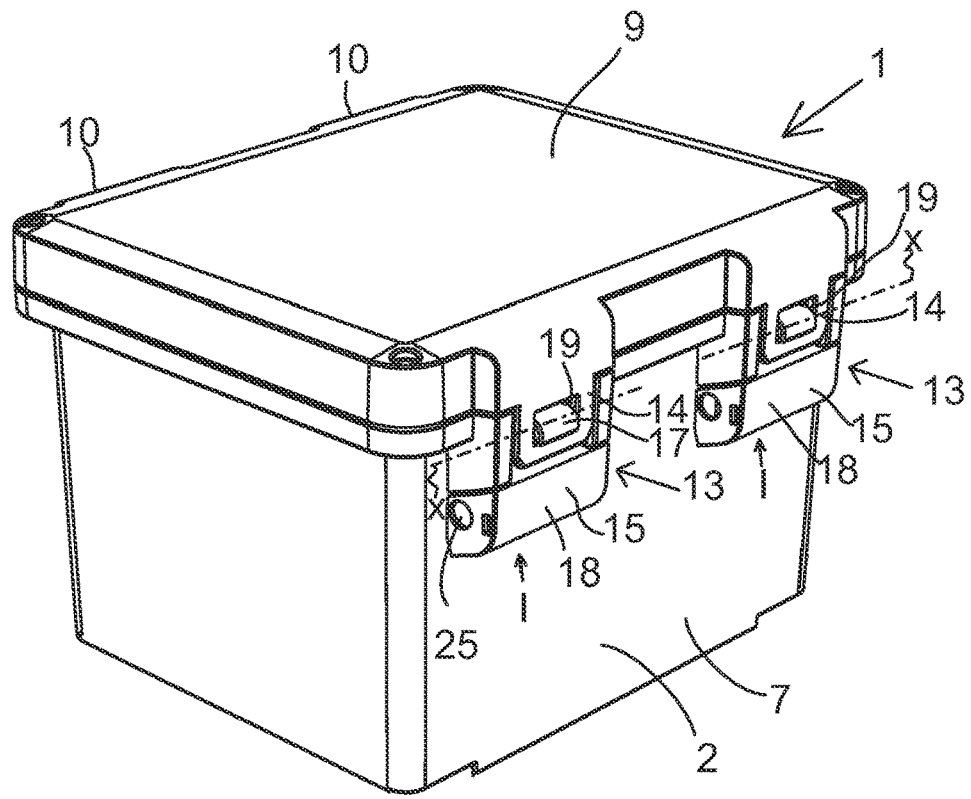
FIG. 1 is an axonometric view of the plastic enclosure according to an embodiment of the invention, seen obliquely from above.

Referring to the drawings in general, FIGS. 1-11 show a plastic enclosure 1 for enclosing industrial components or equipment. Industrial components to be enclosed in the enclosure 1 may be e.g. electrical components, electronic components, and/or equipment that does not involve electricity, such as pneumatic equipment, hydraulic equipment, fiber optics equipment, such as optic fiber splices, optic fiber connectors, optic fiber amplifiers etc. Referring to FIGS. 1-5 the enclosure comprises a case 2. The case is an injection molded box made of thermoplastics. The case 2 comprises a rear wall 3 (see FIG. 2) and four side walls delimiting an interior 4 (see FIG. 3). A mouth opening 5 enables access to the interior 4. The side walls comprise a first side wall 6 and a second side wall 7 which is substantially parallel to the first side wall 6. A sealing flange 8 defines an outer periphery of the mouth opening 5.

The enclosure 1 further comprises a lid 9 for covering the case 2. The lid 9 is injection molded from thermoplastics, preferably from the same thermoplastics material as the thermoplastics material of the case 2. The lid 9 is hinged at the side of the first side wall 6 in this embodiment by two hinges 10 to be movable between a closed position shown in FIG. 1, wherein the lid 9 covers the mouth opening 5 of the case 2, and an open position shown in FIG. 3 to permit access to the interior 4 of the case 2. The number of hinges 10 can be chosen depending on the size of the enclosure 1. The hinges 10 are located near to the mouth opening 5. As can be seen in FIG. 3 and FIGS. 6-9, the lid 9 has a groove 11 arranged at the periphery of the lid 9 to receive therein a resilient sealing gasket 12. The sealing gasket 12 co-operates with the sealing flange 8 when the lid 9 is in the closed position (see FIG. 9). The sealing gasket 12 may be polyurethane which is extruded to the groove 11.

Figure 2:
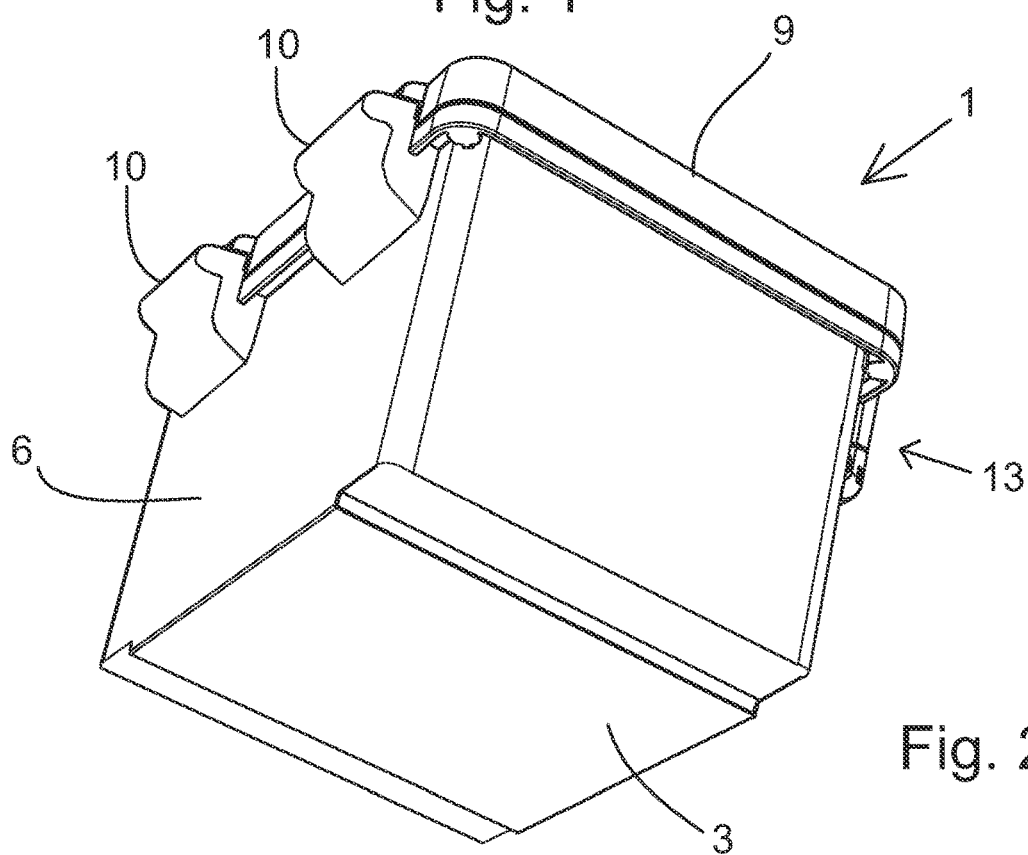
FIG. 2 shows the enclosure of FIG. 1 seen obliquely from beneath.
Figure 3:
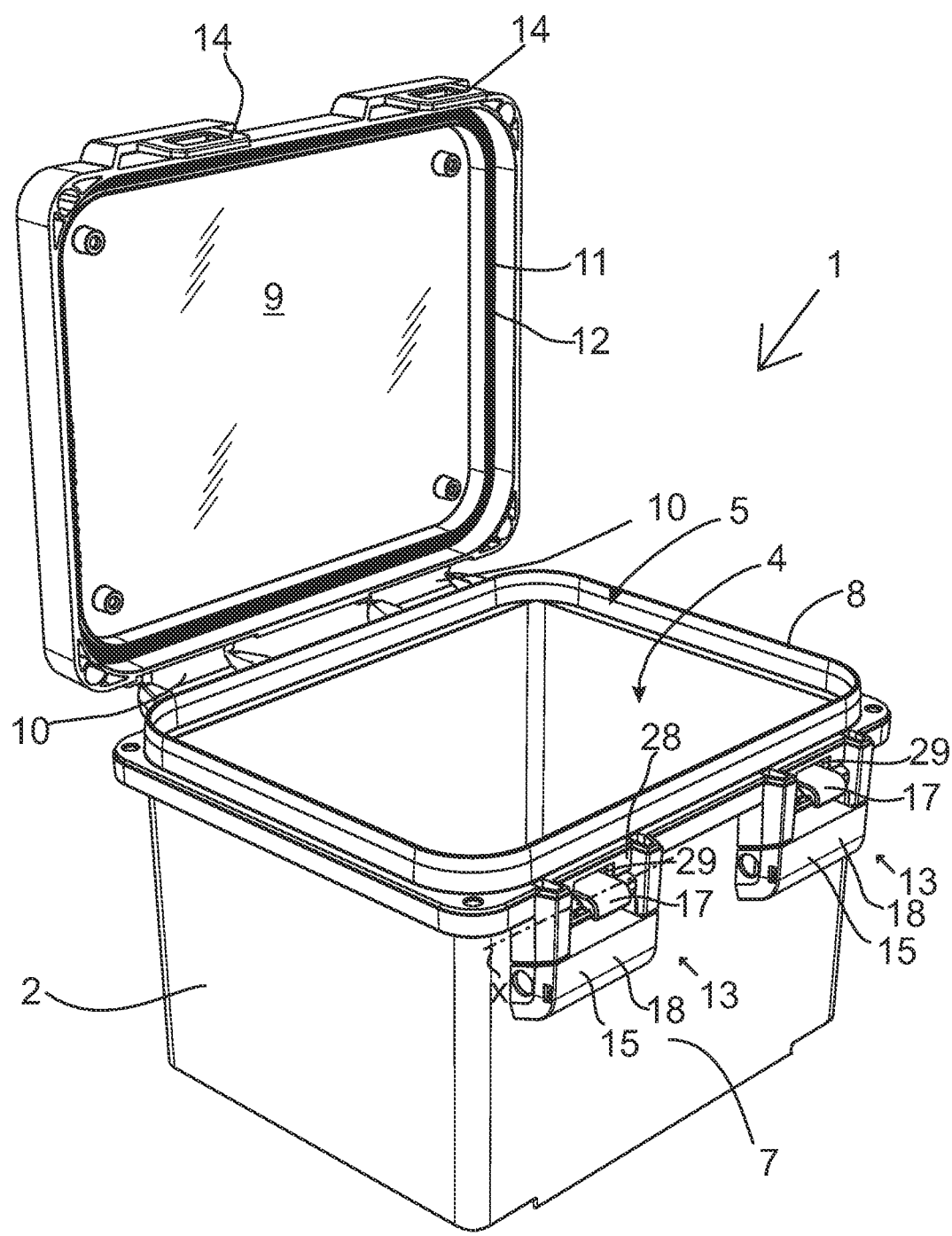
FIG. 3 shows the enclosure of FIG. 1 with a lid in an open position.
Figure 4:
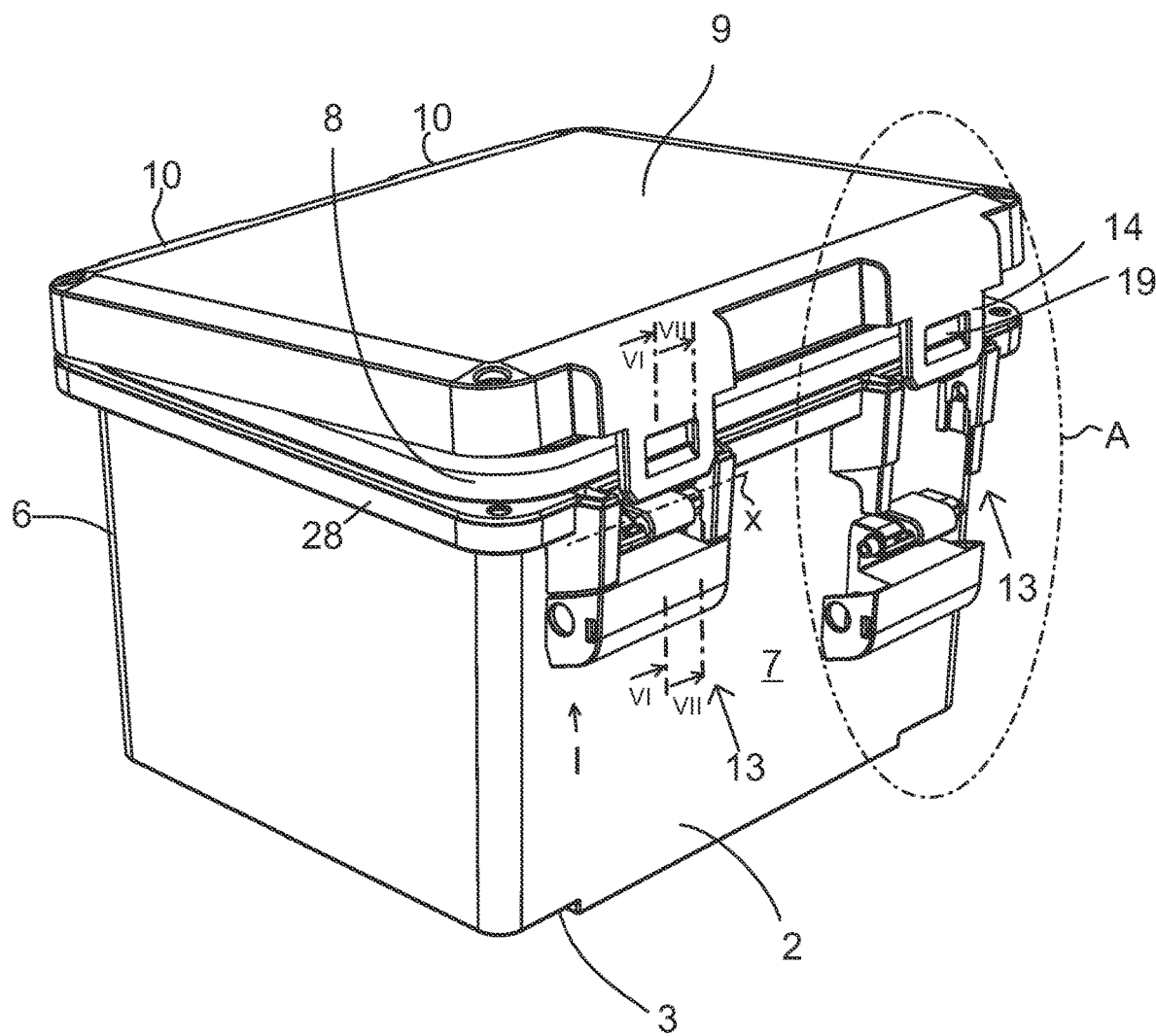
FIG. 4 shows the enclosure of FIG. 4 with the lid being slightly opened and one of the rockers being detached from the mounting brackets.
Figure 8:
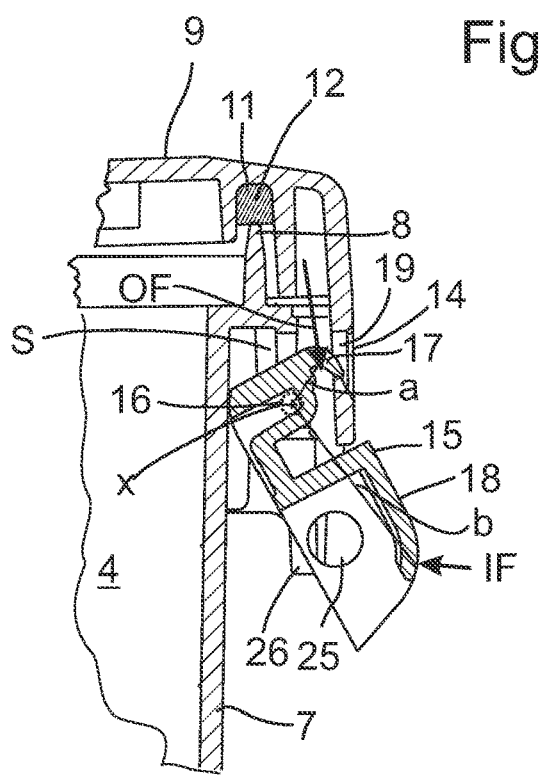
FIG. 8 is a cross-section view corresponding to FIG. 6, the rocker being turned towards locking position and the hook portion staring to grip the lug, FIG. 9 a cross-section view corresponding to FIG. 6, the rocker being turned to a locking position.
Figure 9:
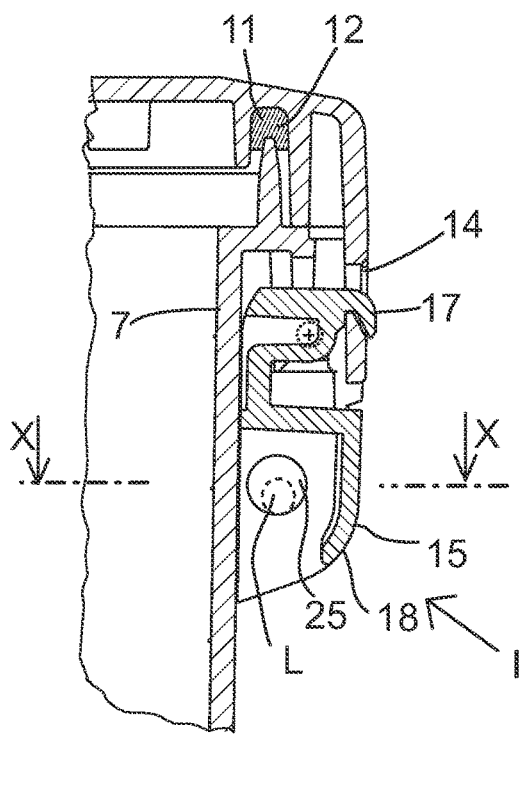

The enclosure 1 further comprises two latch devices 13 for locking the lid 9 relative to the case 2 in the closed position which is shown in FIGS. 1, 2 and 9. The number of the latch devices can be chosen depending on the size of the enclosure 1. The latch device 13 comprises a grip means 14 which is arranged to the lid 9 and a rocker 15 which is removably and pivotally connected with a pivot axle 16 relative to the second side wall. The rocker 15 can be turned about a single axis x between a locking position I (see FIGS. 1, 2 and 9) and a release position II (see FIGS. 6-8). The rocker 15 comprises a pair of pins 22 which form the pivot axle 16 (see FIGS. 5 and 11).

The rocker 15 is an injection molded monolithic one-piece element of thermoplastics. The rocker may be of the same thermoplastics material as the case 2 and the lid 9. Suitable thermoplastic materials for the parts of the enclosure, case, lid and rocker, may be e.g. polycarbonate, acrylonitrile butadiene styrene (ABS) or polyester.

The rocker 15 comprises a hook portion 17 at one side of the pivot axle 16. The hook portion 17 is configures to grip the grip means 14. The rocker 15 further comprises a handle arm 18 at the opposite side of the pivot axle 16 in relation to the hook portion 17. The handle arm 18 is arranged to be manually operable for turning the rocker 15 about the axis x between the locking position I and release position II.

The grip means 14 is a rigid lug 14 molded to be monolithic with the material of lid 9. The lug 14 comprises a through-hole 19 to which the hook portion 17 can grip. The lug 14 is arranged, in the closed position of the lid 9, to extend over and at a distance from the second side wall 7 of the case 2 to be substantially in parallel with the second side wall 7 to delimit an intermediate space S (see FIG. 8) between the second wall 7 and the lug 14 when the lid is in the closed position. The hook portion 17 is arranged so that, in the release position II of the rocker 15, it is turned inside the intermediate space S and away from the path of the lug 14. In the locking position I of the rocker 15, as seen in FIGS. 1 and 9, the hook portion 17 is turned to protrude laterally outwards through the through-hole 19 of the lug 14. In this locking position the sealing flange 8 of the lid 90 pressed against the sealing gasket 12 compresses the sealing gasket 12. The sealing gasket 12 creates a spring force against which the hook portion 17 holds the lug 14. In this locking position I the backside of the handle arm 18 is turned to be flush with the second side wall 7 of the case 2.

Referring to FIG. 8, the output force OF of the hook portion 17 exerted to the lug 14 is amplified by a mechanical advantage provided by a lever effect of the rocker 15 when being turned to the locking position by an input force IF created by hand of the operator and exerted to the handle arm 18. The hook portion 17 and the lug 14 have a mutual contact point at a first radius a from the pivot axis x of the rocker 15. The handle arm 18 has a second radius b from the pivot axis x of the rocker to an outmost point where the handle arm can be manually pressed by hand. The second radius b is a multiple of the first radius a in order to exert an output force by the hook portion on the lug which output force is a multiple of the input force IF exerted to the handle arm to win the spring force provided by the sealing gasket 12 when turning the rocker 15 from the release position II to the locking position I. the ratio a:b of the first radius a to the second radius b is in the range of 1:3 to 15, preferably 1:4.

Figure 5:
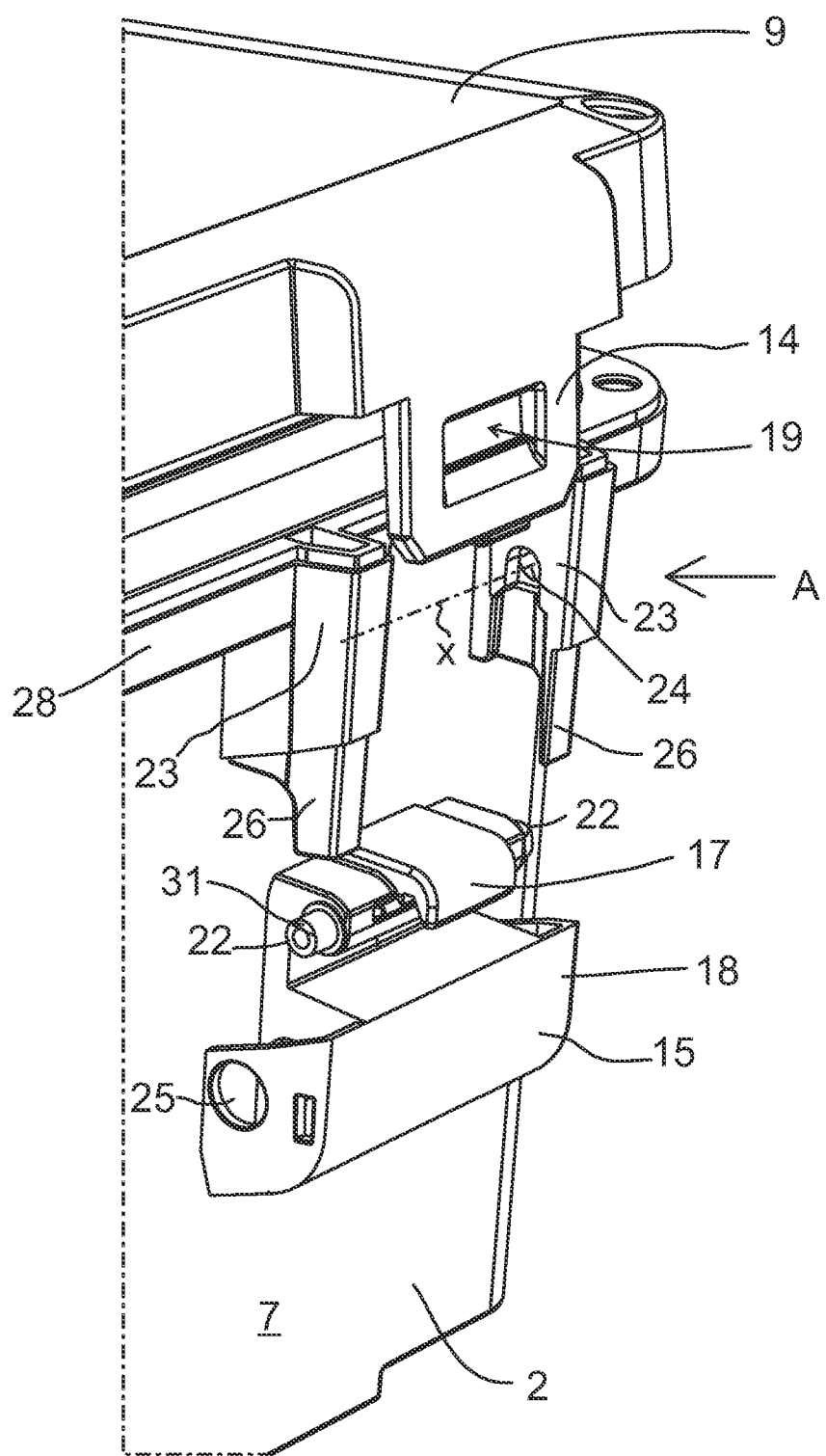
FIG. 5 shows an enlarged detail A from FIG. 4.
Figure 6:
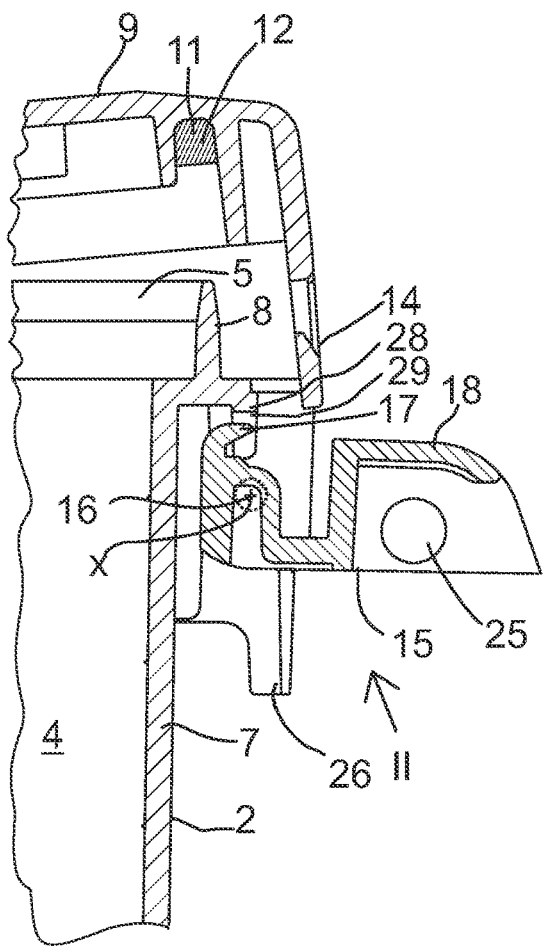
FIG. 6 is a partial cross-section along line VI-VI from FIG. 4, the rocker being turned to a release position.

Referring to the detail A shown in FIG. 5, the case 2 comprises a pair of mounting brackets 23 for mounting of the rocker 15. The mounting brackets 23 are monolithic with the plastics material of the case 2. Each of the mounting brackets 23 comprises a seat 24 to receive and to removably connect the pin 22 of the rocker 15 for pivotally supporting the rocker 15. As can be seen in Figures, at least one of the pins 22 comprises a bevel 31. The bevel 31 assists in mounting of the pins 22 of the rocker 15 to the seats 24 of the mounting brackets 23. The handle arm 18 comprises a locking hole 25. The mounting bracket 23 comprises a retaining projection 26 which protrudes along and at a distance from the second side wall 7. In the locking position I of the rocker 15, as shown in FIG. 10, the locking hole 25 is located between the second wall 7 and the retaining projection 26 to receive a locking element L, such as a locking pin or a shackle of a padlock, to prevent opening of the lid 9.

Figure 10:
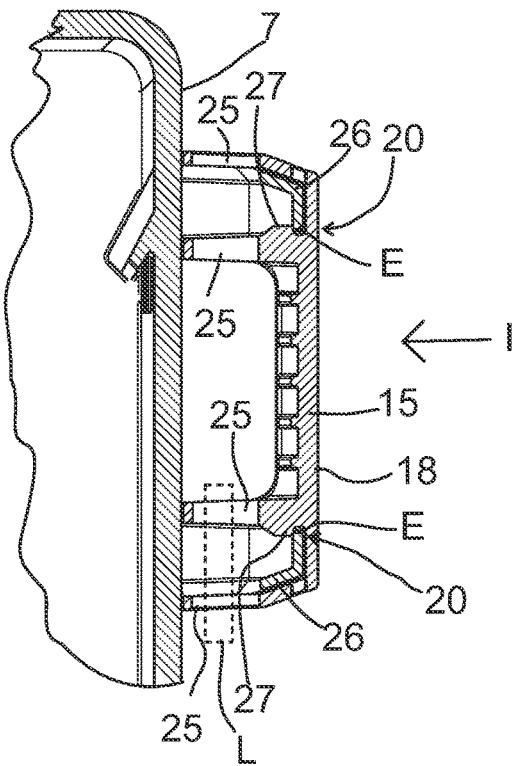
FIG. 10 is cross-section seen in the direction X-X from FIG. 9.
Figure 11:
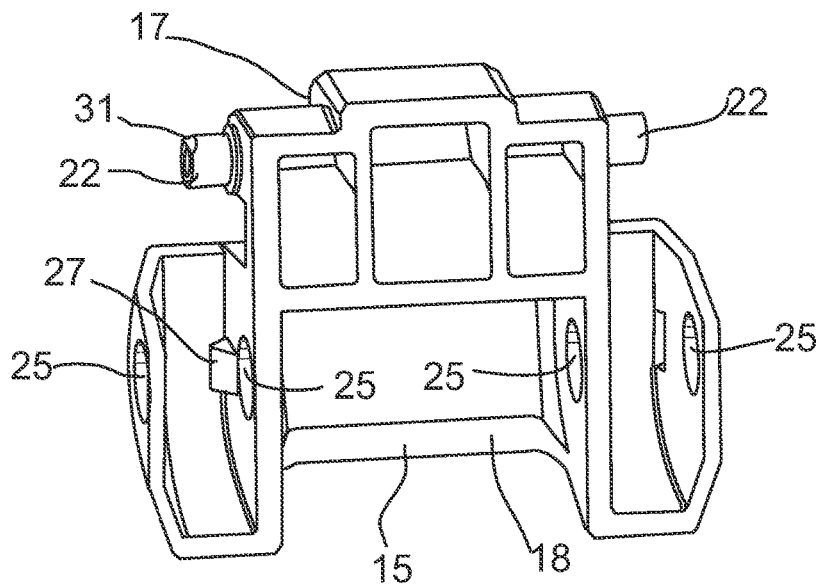
FIG. 11 shows the rocker of the enclosure of FIG. 1 seen from its backside.

As illustrated in FIGS. 10 and 11, the latch device comprises a first snap-fit joint 20 to hold the rocker 15 stationary in the locking position I. The handle arm 18 comprises one or more rigid clips 27 to co-operate with one or more edges E of the retaining projection 26 to form the first snap-fit joint 20 to hold the rocker 15 in the locking position I.

Figure 7:
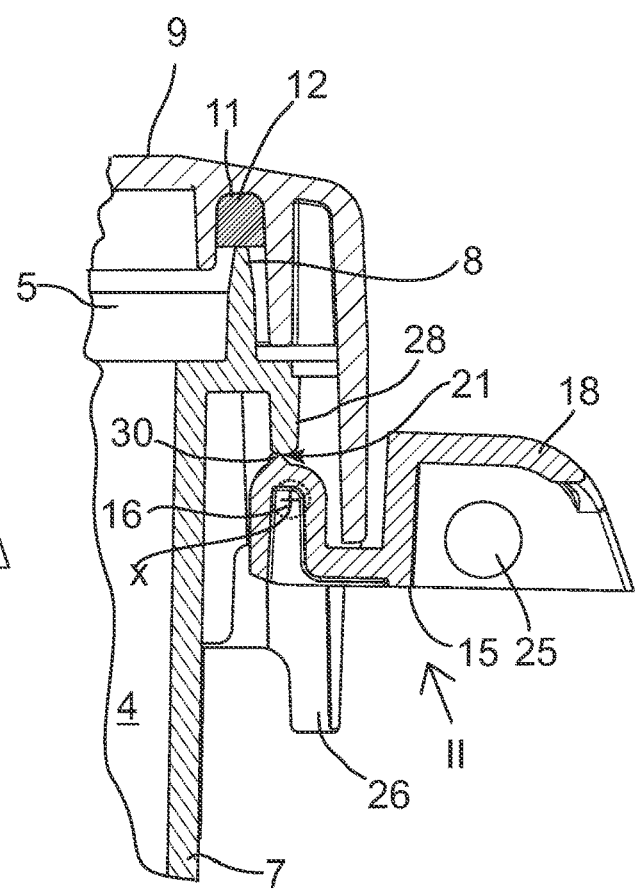
FIG. 7 is a partial cross-section along line VI-VI from FIG. 4 showing the second snap-fit joint.

As illustrated in FIG. 7, the latch device 13 further comprises a second snap-fit joint 21 to hold the rocker 15 stationary in the release position II. The case 2 comprises a prominent collar 28 beside the mouth opening 5. The collar 28 comprises a cutout 29 (see also FIGS. 3 and 6). The cutout 29 is disposed to receive the hook portion 17 of the rocker 15 therein. The collar 28 has one or more edge portions near to the cutout 28 limiting the cutout 29 laterally. As ca be seen in FIG. 7, the rocker 15 comprises one or more rigid clips 30 arranged to co-operate with the one or more edge portions of the collar 28 to form the second snap-fit joint 21 to hold the rocker 15 in the release position II.

Although the invention has been the described in conjunction with a certain type of enclosure, it should be understood that the invention is not limited to any certain type of enclosure. While the present inventions have been described in connection with a number of exemplary embodiments, and implementations, the present inventions are not so limited, but rather cover various modifications, and equivalent arrangements, which fall within the purview of prospective claims.

The invention claimed is:

1. A plastic enclosure for enclosing industrial components, the plastic enclosure comprising
   a case molded from plastics comprising a rear wall and four side walls delimiting an interior, a mouth opening enabling access to the interior, the side walls comprising a first side wall and a second side wall which is parallel to the first side wall,
   a lid molded from plastics for covering the case, the lid being hinged at a side of the first side wall by one or more hinges to be movable between an closed position, wherein the lid covers the mouth opening of the case, and an open position to permit access to the interior, the hinge being located near to the mouth opening,
   one or more latch devices for locking the lid relative to the case in the closed position, the latch device comprising a grip means arranged to the lid and a rocker connected removably and pivotally with a pivot axle relative to the second side wall to be turnable about a single axis between a locking position and a release position, the rocker comprising a hook portion at one side of the pivot axle, which hook portion can grip the grip means, and a handle arm at the opposite side of the pivot axle in relation to the hook portion, the handle arm being arranged to be manually operable for turning the rocker about the pivot axis between the locking and release positions,
   wherein the grip means is a rigid lug molded to be monolithic with the lid, the lug comprising a through-hole to which the hook portion can grip, the lug being arranged, in the closed position of the lid, to extend over and at a distance from the second side wall to be substantially in parallel with the second side wall to limit an intermediate space between the second side wall and the lug when the lid is in the closed position, and the hook portion is arranged so that, in the release position of the rocker, it is turned inside the intermediate space away from the path of the lug and, in the locking position of the rocker, the hook portion is turned to protrude laterally outwards through the through-hole of the lug, wherein the case comprises a sealing flange defining an outer periphery of the mouth opening; that the lid comprises a groove arranged at the periphery of the lid to receive therein a resilient sealing gasket, to co-operate with the sealing flange when the lid is in the closed position; that the hook portion is arranged to compress the sealing gasket by pressing the sealing flange against the sealing gasket to create a spring force against which the hook portion holds the lug; and that the output force of the hook portion exerted to the lug is amplified by a mechanical advantage provided by a lever effect of the rocker when being turned to the locking position by an input force exerted to the handle arm.

2. The plastic enclosure according to claim 1, wherein the latch device comprises a snap-fit joint to hold the rocker stationary in the locking position.

3. The plastic enclosure according to claim 1, wherein the latch device comprises a snap-fit joint to hold the rocker stationary in the release position.

4. The plastic enclosure according to claim 1, wherein the hook portion and the lug have a mutual contact point at a first radius from the pivot axis of the rocker, and the handle arm has a second radius from the pivot axis of the rocker to an outmost point where the handle arm can be manually pressed by hand, the second radius being a multiple of the first radius in order to exert an output force by the hook portion on the lug which output force is a multiple of the input force exerted to the handle arm to win the spring force provided by the sealing gasket when moving the rocker from the release position to the locking position.

5. The plastic enclosure according to claim 4, wherein the ratio of the first radius to the second radius is in the range of 1:3 to 15.

6. The plastic enclosure according to claim 1, wherein the rocker is a molded monolithic one-piece element of plastics, the rocker comprising a pair of pins which form the pivot axle.

7. The plastic enclosure according to claim 1, wherein the case comprises a pair of mounting brackets for mounting of the rocker, the mounting brackets being monolithic with the case.

8. The plastic enclosure according to claim 7, wherein each mounting bracket comprises a seat to receive and to removably connect the pin of the rocker for pivotally supporting the rocker, the mounting brackets being molded as monolithic with the case.

9. The plastic enclosure according to claim 1, wherein the handle arm comprises a locking hole.

10. The plastic enclosure according to claim 9, wherein the mounting bracket comprises a retaining projection which protrudes along and at a distance from the second wall; and wherein, in the locking position of the rocker, the locking hole is located between the second wall and the retaining projection to receive a locking element, such as a locking pin or a shackle of a padlock.

11. The plastic enclosure according to claim 9, wherein the handle arm comprises one or more rigid clips to co-operate with one or more edges of the retaining projection to form the snap-fit joint to hold the rocker in the locking position.

12. The plastic enclosure according to claim 9, wherein the case comprises a prominent collar beside the mouth opening, the collar comprising a cutout which is disposed to receive the hook portion of the rocker therein, the collar having one or more edge portions near to the cutout, and wherein the rocker comprises one or more rigid clips arranged to co-operate with the one or more edge portions to form the second snap-fit joint to hold the rocker in the release position.

13. The plastic enclosure according to claim 4, wherein the ratio of the first radius to the second radius is 1:4.

* * * * *